United States Patent [19]
Jaenker

[11] Patent Number: 6,043,587
[45] Date of Patent: Mar. 28, 2000

[54] PIEZOELECTRIC ACTUATOR

[75] Inventor: Peter Jaenker, Garching, Germany

[73] Assignee: DaimlerChrysler AG, Stuttgart, Germany

[21] Appl. No.: 09/165,792

[22] Filed: Oct. 2, 1998

[30] Foreign Application Priority Data

Oct. 15, 1997 [DE] Germany .......................... 197 45 468

[51] Int. Cl.[7] .................................................. H01L 41/08
[52] U.S. Cl. ....................... 310/328; 310/330; 310/359; 310/366
[58] Field of Search .......................... 310/328, 330–332, 310/358, 359, 366

[56] References Cited

U.S. PATENT DOCUMENTS

| | | | |
|---|---|---|---|
| 2,540,187 | 2/1951 | Cherry, Jr. ........................... | 310/366 X |
| 2,540,194 | 2/1951 | Ellett .................................. | 310/366 X |
| 2,836,737 | 5/1958 | Crownover ......................... | 310/366 X |
| 3,115,588 | 12/1963 | Hueter ................................ | 310/366 X |
| 3,531,742 | 9/1970 | Saito et al. ......................... | 310/366 X |
| 5,225,731 | 7/1993 | Owen .................................. | 310/366 |
| 5,786,655 | 7/1998 | Okumura et al. .................. | 310/328 X |
| 5,861,704 | 1/1999 | Kitami et al. ....................... | 310/359 X |

*Primary Examiner*—Mark O. Budd
*Attorney, Agent, or Firm*—W. F. Fasse; W. G. Fasse

[57] ABSTRACT

A piezoelectric actuator or sensor includes a solid state body made of a monolithic piezoelectric material, a plurality of actuating electrodes formed as closed-loop electrodes entirely around the perimeter of the solid state body, and a support plate with two contact electrodes respectively having interdigitally intermeshing contact fingers arranged thereon. The intermeshing or alternating contact fingers of the two contact electrodes respectively contact alternating ones of the actuating electrodes, preferably through an adhesive layer having conducting particles dispersed therein. The energized actuating electrodes effectively form virtual piezoelectric layers in the solid state body.

17 Claims, 2 Drawing Sheets

6,043,587

PIEZOELECTRIC ACTUATOR

This application is based on and claims the priority under 35 U.S.C. §119 of German Patent Application 197 45 468.2, filed on Oct. 15, 1997, the entire disclosure of which is incorporated herein by reference.

FIELD OF THE INVENTION

The invention relates to a piezoelectric actuator including a solid state body of a one-piece piezoelectric material and stripe-shaped electrodes extending transversely across the surface of the solid state body, whereby alternate adjacent electrodes can be energized with opposite voltages in order to vary the length of the solid state body due to the piezoelectric effect. The solid state body includes integrally interconnected piezoelectric layers having layer thicknesses corresponding to the spacing between adjacent electrodes.

BACKGROUND INFORMATION

U.S. Pat. Nos. 2,540,194 and 5,225,731 each disclose piezoelectric actuators of the above mentioned general type. Namely, the known actuators comprise a one-piece integral piezoelectric solid state body that has stripe-shaped electrodes applied on opposite outer surfaces thereof, whereby the electrodes are spaced apart from each other in the lengthwise direction of the solid state body, and respective paired electrodes positioned opposite each other are electrically connected to each other. Adjacent electrodes in the lengthwise direction are alternately energizable with opposite voltages. This arrangement creates a plurality of virtual piezoelectric layers having layer thicknesses corresponding to the electrode spacing. The piezoelectrically induced strain in the piezoelectric layers is summed or added together along the lengthwise direction of the solid state body.

The above described known actuators are intended to be simpler than other prior art actuators, in view of the monolithic structure of the solid state body. However, in order to achieve a sufficiently homogenous electric field line pattern, the solid state body must have a rather small plate thickness and is therefore correspondingly sensitive to breakage. Furthermore, the contact arrangement necessary for energizing the electrodes is rather complicated because a double electrode connection is necessary at the end of each piezoelectric layer. Thus, the complexity of i-he overall contact arrangement and the effort involved in assembling the known piezoelectric actuators is quite considerable, especially if a large number of piezoelectric layers is to be used in order to achieve an advantageous amplification or summation of the piezoelectric effect.

SUMMARY OF THE INVENTION

In view of the above, it is an object of the invention to provide a piezoelectric actuator of the above described general type, whereby the fabrication can be simplified and the mechanical stability as well as the energy efficiency of the actuator can be improved. It is a particular object of the invention to provide an improved contact arrangement for such a piezoelectric actuator. The invention further aims to avoid or overcome the disadvantages of the prior art, and to achieve additional advantages, as apparent from the present description.

The above objects have been achieved in a piezoelectric actuator according to the invention, including a solid state body of a one-piece piezoelectric material, and stripe-shaped actuating electrodes that extend entirely or substantially entirely around the perimeter of the outer surfaces of the solid state body bounding the cross-section of the solid state body. The feature that the actuating electrodes extend at least "substantially entirely" around the perimeter of the solid state body means that the electrodes ere essentially continuous closed-loop electrodes, having at most unavoidable processing gaps or a gap of not more than 5% of the total perimeter therein, whereby the important consideration is that the electric field generated by the electrodes in the solid state body should not be disrupted by the presence of such a minor gap. Also, the location of any such gap should not interfere with the electrical contact established to the electrode.

The electrodes are spaced apart from each other in the lengthwise direction of the solid state body, whereby integrally interconnected virtual piezoelectric layers respectively having a layer thickness corresponding to the electrode spacing are formed within the solid state body. Alternating adjacent electrodes are adapted to be Energized with a voltage of opposite polarity in order to vary the length of the solid state body due to the piezoelectric effect in each piezoelectric layer.

Also according to the invention, the actuator further comprises a support plate and contact electrodes arranged on the support plate, whereby each contact electrode has a comb-shaped configuration including contact fingers extending from a spine electrode. The contact electrodes are arranged such that the contact fingers of the opposite contact electrodes interdigitally intermesh with each other. This arrangement provides a simple structure that can be simply assembled, whereby the alternating stripe-shaped actuating electrodes are brought into contact alternately with one or the other of the contact electrodes, so as to energize the alternating actuating electrodes with an opposite polarity voltage.

By providing the stripe-shaped actuating electrodes in the form of continuous closed-loop electrodes respectively extending at least substantially entirely around the perimeter of the solid state body defined by the outer surfaces bounding the cross-section of the solid state body, the invention improves the homogeneity of the electric field pattern in the individual piezoelectric layers and thereby improves the energy efficiency of the actuator. Moreover, by providing the support plate with two interdigitally intermeshing contact electrodes arranged thereon, the invention provides a simple manner of achieving a surfacial contact between alternating ones of the stripe-shaped actuating electrodes and the alternating oppositely energized contact fingers of the two contact electrodes. Thereby the mechanical strength of the actuator assembly is increased, and the fabrication of the actuator is simplified, while achieving a secure, reliable, and problem-free electrical connection for energizing the individual actuating electrodes in the appropriate alternating manner.

In order to increase the power output capacity of the actuator in a simple manner in relation to the circuit arrangement, a further embodiment according to the invention provides for a plurality of solid state bodies arranged and secured adjacent one another on the support plate or arranged stacked on top of one another, in such a manner that the actuating electrodes of the adjacent solid state bodies mutually contact each other. In this manner, a plurality of solid state bodies can be simultaneously energized and actuated, without requiring additional complicated electrical interconnections between or among the respective actuating electrodes of the solid state bodies.

According to the invention it is further possible to provide a tri-morphic actuator that is bendably deformable to both sides, for use in applications requiring an actuating displacement perpendicularly to the major surface extension of the solid state body. To achieve such a tri-morphic actuator structure, the comb-shaped interdigitally intermeshing contact electrodes are provided both on the top surface and on the bottom surface of the support plate, and respective solid state bodies are arranged on the top surface and on the bottom surface of the support plate respectively in contact with the corresponding contact electrodes.

A further detail of the invention provides an especially simple manner for connecting the solid state bodies respectively to each other and to the support plate. Namely, this can be achieved by respective mutual adhesive bonding of the components to each other. In order to ensure that a reliable electrical contact is achieved between the stripe-shaped actuating electrodes and the comb-shaped interdigital contact electrodes, with a minimum fabrication effort, electrically conducting contact particles having a particle size corresponding to the adhesive layer thickness are mixed into the adhesive that is used for achieving the above mentioned adhesive bonding. Thus, the adhesive layer applied between the solid state body and the support plate simultaneously mechanically bonds the components to each other and provides electrical contact between the actuating electrodes and the contact electrodes.

The stripe-shaped actuating electrodes are preferably sputtered onto the piezoelectric material of the solid state body in order to further simplify the fabrication of the actuator. The sputtering process may also be easily controlled to precisely achieve the desired sparing and dimensioning of the actuating electrodes without further patterning steps.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
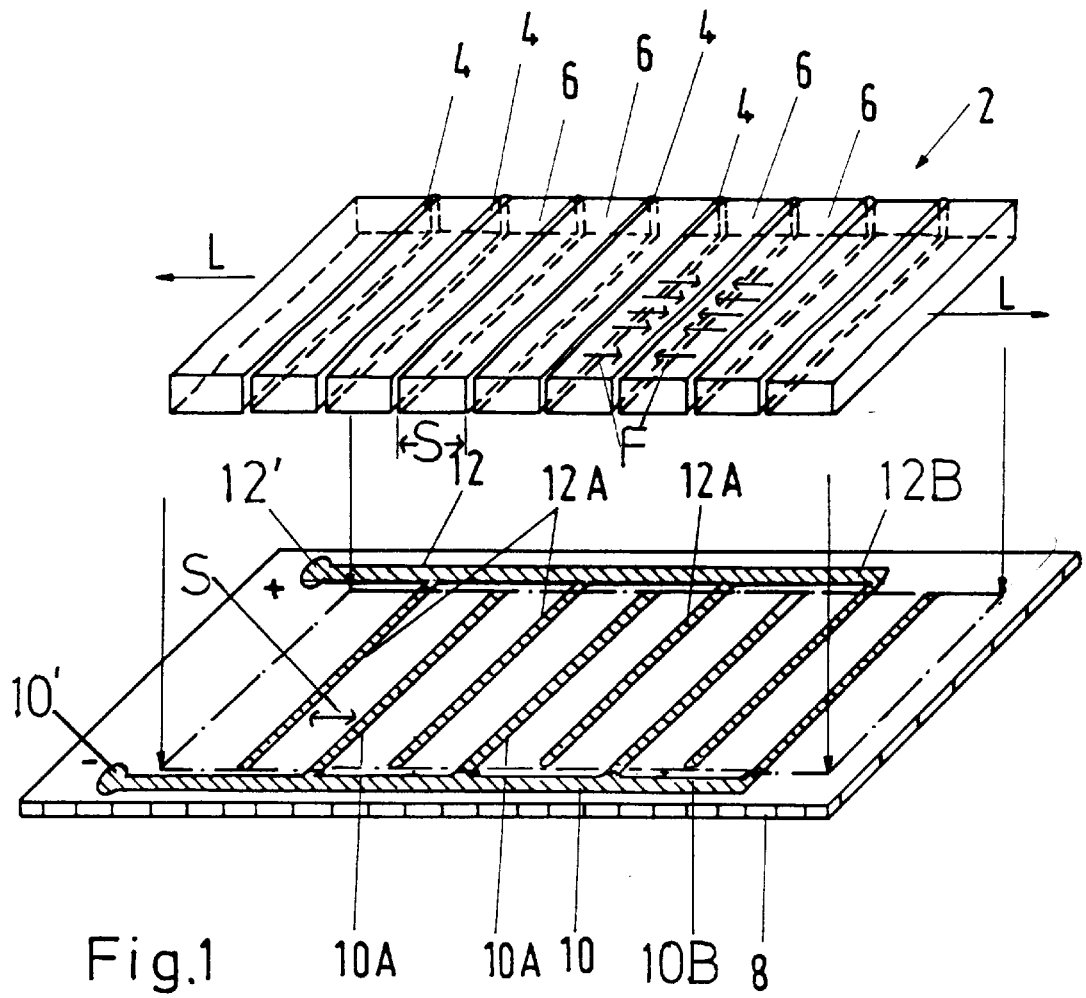
FIG. 1 is a schematic perspective exploded view of an actuator according to the invention having a one-piece plate-shaped solid state body and an associated support and conductor plate, before these two components are adhesively bonded together.

The piezoelectric actuator shown in FIG. 1 comprises a plate-shaped solid state body 2 that consists of a single integral or monolithic piece of a piezoceramic material having a lengthwise extension in a lengthwise direction L. The actuator further comprises a plurality of stripe-shaped actuating electrodes 4 that are each a respective closed loop extending substantially perpendicularly to the lengthwise direction L entirely around the perimeter of the piezoelectric solid state body 2, namely around the outer surfaces that bound the substantially rectangular cross-section of the solid state body 2. The respective adjacent electrodes 4 extend parallel to each other and are spaced apart from each other by a uniform spacing distance S in the lengthwise direction L.

If respective high and low voltage potentials, or for example positive and negative voltage potentials, are alternatingly applied to the successive actuating electrodes 4, then the differential voltage between respective adjacent electrodes 4 is dissipated through the solid state material between the respective electrodes. Accordingly, also, the differential voltage between respective adjacent actuating electrodes 4 induces respective anti-polar electric fields F (see also FIG. 3) directed in the lengthwise direction L between adjacent electrodes 4 in the piezoelectric material of the solid state body 2. This effectively forms alternating virtual zones or piezoelectric layers 6 in the piezoelectric material, whereby each piezoelectric layer 6 will undergo a strain in the lengthwise direction L due to the piezoelectric effect caused by the applied voltage. Furthermore, the overall solid state body 2 will exhibit a strain, e.g. an elongation, in the lengthwise direction L resulting from the cumulative piezoelectric d33-effects of the individual piezoelectric layers 6.

In order to apply the necessary electrical actuating voltage to the stripe-shaped actuating electrodes 4, a support plate 8 is embodied as a circuit board or conductor plate and has comb-shaped interdigitally intermeshing contact electrodes 10 and 12 applied thereon as shown in FIG. 1. The respective interdigital contact fingers or finger-shaped conductor paths 10A and 12A of the contact electrodes 10 and 12 respectively extend from the spine electrodes 10B and 12B, and are uniformly spaced from one another in the lengthwise direction L at the same spacing distance S as the actuating electrodes 4 on the solid state body 2. Thus, when the solid state body 2 is arranged on the support plate 8, as will be described below, the contact electrodes 10 and 12, and particularly the interdigital contact fingers 10A and 12A, come into contact with the alternating actuating electrodes 4.

To assemble the actuator, a thin adhesive layer 14 (as particularly shown in FIG. 3) is coated onto the support plate 8, and then the solid state body 2 with its electrodes 4 thereon is pressed with a high pressing force surfacially against the adhesive-coated support plate 8. This is carried out with sufficient precision of the position or registration of the solid state body 2 on the support plate 8 to ensure that the alternating ones of the electrodes 4 come into overlapping arrangement on the interdigital contact fingers 10A and 12A of the contact electrodes 10 and 12 and thus form line contacts therealong.

The adhesive layer 14 comprises an electrically insulating adhesive material 14' forming a matrix, and electrically conducting contact particles 16, for example nickel particles, mixed into the adhesive material 14'. The contact particles 16 have a particle size that generally corresponds to or is slightly less than the applied layer thickness of the adhesive layer 14. Thus, when the solid state body 2 is pressed against the support plate 8 with a pressing force, the actuating electrodes 4 are pressed firmly into contact with, or even partially embedded into, the adhesive layer 14, whereby the contact particles 16 being pressed between the actuating electrodes 4 and the interdigital contact fingers 10A or 12A establish a reliable electrical connection therebetween (see FIG. 3). At the same time, the insulating effect of the adhesive material 14' of the adhesive layer 14 is maintained in the remaining areas, i.e. the areas between the electrodes 4. The electrical conducting and insulating effects required in any particular case can be achieved by appropriately adjusting the proportional content amount of the contact particles 16 and appropriately dimensioning the particle size of the contact particles 16 relative to the layer thickness of the adhesive layer 14.

In the example (embodiment shown in FIG. 1, a solid state body 2 is adhesively bonded onto only one side or one surface of the support plate 8. In this embodiment, if the support plate 8 consists of a soft elastic material that is easily strainable in the lengthwise direction L, then the piezoelectric effect in the solid state body 2 will cause a purely linear lengthwise strain or length variation of the solid state body 2. Thereby the support plate 8 will follow and also undergo the expansion and contraction movements of the solid state body 2 due to the thrust-transmitting adhesive bonding between the two components provided by the adhesive layer 14. Alternatively, if the support plate 8 is highly stiff and resistant to strain in the lengthwise direction L, then the support plate 8 will not follow or undergo the piezoelectrically induced length variations of the solid state body 2 in the lengthwise direction L. Instead, the lengthwise elongation of the solid state body 2 will cause the support plate 8 to bend in a direction perpendicular to the plane of the plate, so that the actuator will act as a bi-morphic bending actuator element.

Figure 2:
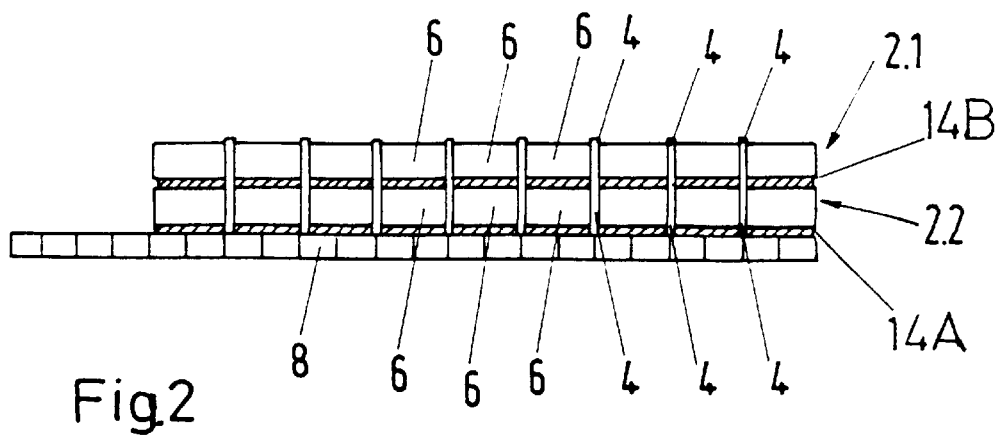
FIG. 2 is a schematic side view of a piezoelectric actuator having two plate-shaped solid state bodies stacked on top of each other.

The actuator according to FIG. 2 generally corresponds to the embodiment described above in connection with FIG. 1 with regard to the structure, fabrication, and functional operation thereof, but has been modified as follows. While the actuator of FIG. 1 includes only a single solid state body 2 arranged on the support plate 8, the actuator according to FIG. 2 comprises at least two solid state bodies 2.1 and 2.2 stacked on top of each other on the support plate 8. This arrangement sums together the output power of the two solid state bodies 2.1 and 2.2 and thereby amplifies the total output power of the actuator.

To conveniently assemble this actuator and provide the necessary electrical connections, a first adhesive layer 14A including conducting contact particles embedded in an insulating adhesive material is provided between the bottom solid state body 2.2 and the support plate 8 as described above, and a second adhesive layer 14B including contact particles embedded in an adhesive material is arranged between the top solid state body 2.1 and the bottom solid state body 2.2. When this sandwich stack is pressed together, the contact particles form the necessary contact between the individual contact fingers 10A and 12A and the electrodes 4 of the bottom solid state body 2.2, and between the respective electrodes 4 of the top and bottom solid state bodies 2.1 and 2.2. Furthermore, the adhesive layer 14B provides a force-transmitting bond between the two solid state bodies 2.1 and 2.2 to achieve the necessary power coupling.

Figure 3:
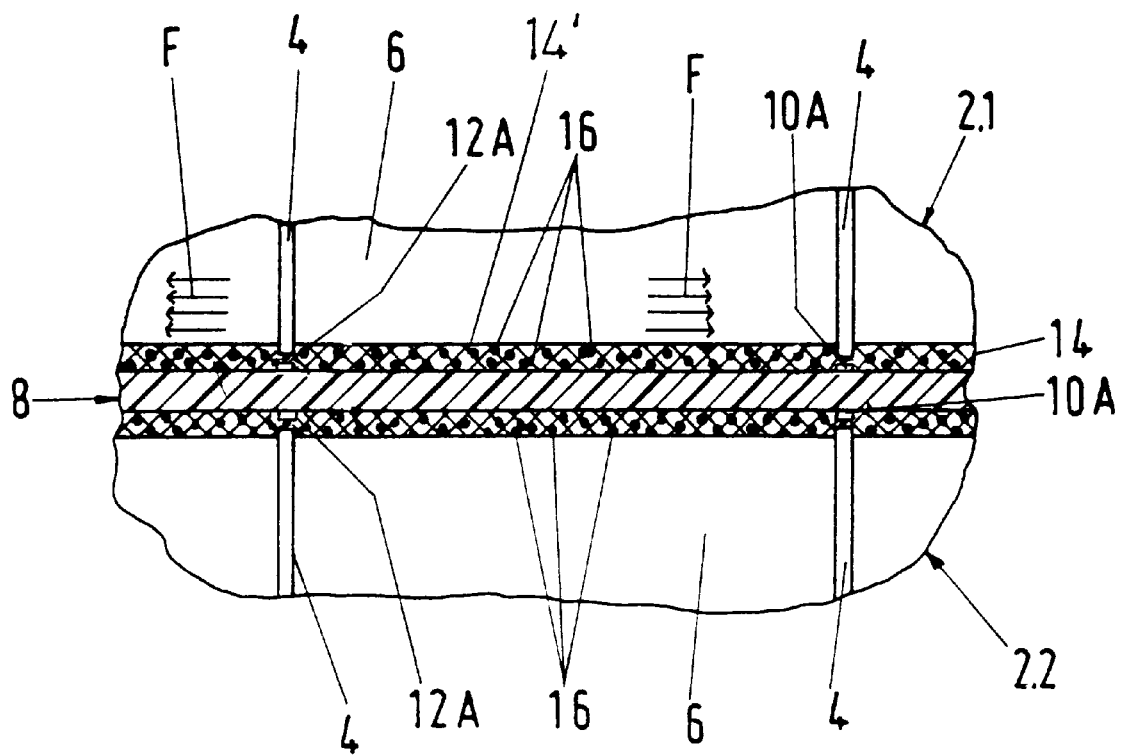
FIG. 3 is a schematic partial broken view of a tri-morphic actuator including two solid state bodies adhesively bonded onto opposite sides of a support and conductor plate, whereby certain dimensions have been greatly exaggerated for the sake of clarity.

FIG. 3 illustrates a tri-morphic actuator having two solid state bodies 2.1 and 2.2 arranged as outer bodies on respective opposite sides or opposite surfaces of the support plate 8 that is adhesively bonded therebetween. In this embodiment, corresponding contact electrodes 10 and 12 are respectively provided on both the top and bottom surfaces of the support plate 8. By separately electrically actuating the two solid state bodies 2.1 and 2.2, e.g. actuating the two bodies 2.1 and 2.2 with electrically opposite polarities at any time, it is possible to actively bend the tri-morphic actuator from the illustrated neutral position selectively in both directions perpendicularly to the plane of the plate, as required.

In a concrete Example of the inventive arrangement, the solid state body 2 was formed of a one-piece unitary piezoceramic plate having a length of 40 mm, a width of 10 mm, and a thickness of 200 µm. Stripe-shaped actuating electrodes 4 having a width of 20 µm and a height or thickness of approximately 5 µm were formed as closed-loop, continuous perimeter electrodes around the solid state body 2, with an electrode spacing of 250 µm to form individual piezoelectric layers 6 having a corresponding layer thickness of 250 µm. The thickness of the adhesive layer 14 and the particle size of the nickel particles 16 was 10 µm.

The stripe-shaped actuating electrodes 4 can be formed by either of two methods. By a first method, a uniform thin film of an electrically conducting material is coated, for example by an electrochemical process, onto the entire surface of the unpolarized sintered ceramic plate, and then the stripe-shaped electrodes 4 having the required configuration are patterned into the continuous thin film by a mechanical machining process, by laser machining or etching, or by chemical etching or the like. According to a second method, the electrodes 4 are directly sputtered onto the piezoceramic plate with the required finished electrode pattern or configuration.

While the above example embodiments have been described in connection with active piezoelectric actuators, the same structure and arrangement can be used as a deformation or displacement sensor, by utilizing the direct piezoelectric effect. Namely, any displacement or deformation applied as an input to the structure will result in a corresponding output voltage being generated by the piezoelectric effect, whereby the output voltage is conducted through the electrodes 4, 10 and 12 to terminals 10' and 12'.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A piezoelectric transducer, comprising:
   a first solid state body of a single unitary piece of piezoelectric material having a longest dimension defining a lengthwise direction;
   a plurality of stripe-shaped actuating electrodes that are each arranged on outer surfaces of said solid state body so as to extend at least substantially entirely around a perimeter of said solid state body defined by said outer surfaces, and that are respectively spaced apart from one another in said lengthwise direction;
   a support plate; and
   first and second contact electrodes that each respectively comprise a spine electrode and contact fingers extending therefrom, arranged on a first surface of said support plate such that said contact fingers of said first contact electrode are alternately interdigitally intermeshed with said contact fingers of said second contact electrode;
   wherein said solid state body is arranged on said support plate with alternating ones of said actuating electrodes electrically contacting respective ones of said contact fingers of said first contact electrode and of said second contact electrode alternately.

2. The piezoelectric transducer according to claim 1, adapted to function as a piezoelectric actuator, adapted to have respective actuating voltages of opposite polarity respectively applied to said first and second contact electrodes for correspondingly energizing said alternating actuating electrodes, so as to form alternately energized piezoelectric layers of said piezoelectric material integrally interconnected with each other in said solid state body, whereby said piezoelectric layers undergo piezoelectrically induced strain in said lengthwise direction.

3. The piezoelectric transducer according to claim 1, adapted to function as a piezoelectric sensor, adapted to have a physical displacement applied to said support plate, whereby said solid state body undergoes a strain in said lengthwise direction so that virtual piezoelectric layers of said piezoelectric material respectively between said actuating electrodes piezoelectrically generate opposite voltages that are conducted through said actuating electrodes to said contact electrodes.

4. The piezoelectric transducer according to claim 1, wherein said solid state body is a rectangular plate-shaped monolithic body of said piezoelectric material, and each said contact electrode is a respective continuous closed-loop electrode extending on a respective plane perpendicular to said lengthwise direction entirely around said perimeter of said solid state body.

5. The piezoelectric transducer according to claim 1, wherein each said contact finger of said first and second contact electrodes has a length extending substantially entirely across a corresponding width of said solid state body, and wherein said electrical contacting of said actuating electrodes with said contact fingers respectively comprises a line contact along said length of said contact finger.

6. The piezoelectric transducer according to claim 1, wherein said support plate is strainable together with said solid state body in said lengthwise direction.

7. The piezoelectric transducer according to claim 1, wherein said support plate is flexibly bendable in a direction perpendicular to a plane of said support plate, and is relatively stiff against a strain of said solid state body in said lengthwise direction.

8. The piezoelectric transducer according to claim 1, further comprising a second solid state body of a piezoelectric material arranged on said support plate adjacent and connected to said first solid state body, and a second set of said actuating electrodes arranged on said second solid state body and respectively electrically contacting said actuating electrodes on said first solid state body.

9. The piezoelectric transducer according to claim 1, further comprising a second solid state body of a piezoelectric material, and a second set of said actuating electrodes arranged on said second solid state body, wherein said second solid state body is stacked on top of and connected to said first solid state body on a surface thereof opposite said support plate such that said second set of actuating electrodes on said second solid state body respectively electrically contact said actuating electrodes on said first solid state body.

10. The piezoelectric transducer according to claim 9, further comprising respective adhesive layers respectively arranged between said first surface of said support plate and said first solid state body and between said first solid state body and said second solid state body, wherein each said adhesive layer comprises an electrically insulating adhesive material and electrically conducting particles dispersed therein.

11. The piezoelectric transducer according to claim 1, further comprising a second set of said first and second contact electrodes arranged on a second surface opposite said first surface of said support plate, a second solid state body of a piezoelectric material, and a second set of said actuating electrodes arranged on said second solid state body, wherein said second solid state body is arranged on said second surface of said support plate with said second set of actuating electrodes in electrical contact respectively alternatingly with said second set of said first and second contact electrodes.

12. The piezoelectric transducer according to claim 11, further comprising respective adhesive layers arranged respectively between said first and second solid state bodies and said first and second surfaces of said support plate, wherein each said adhesive layer comprises an electrically insulating adhesive material and electrically conducting particles dispersed therein.

13. The piezoelectric transducer according to claim 1, further comprising an adhesive layer arranged between said solid state body and said support plate to adhesively bond said solid state body to said support plate.

14. The piezoelectric transducer according to claim 13, wherein said adhesive layer comprises an adhesive material and electrically conducting particles dispersed in said adhesive material.

15. The piezoelectric transducer according to claim 14, wherein said particles have a particle size corresponding to a layer thickness of said adhesive layer.

16. The piezoelectric transducer according to claim 15, wherein said adhesive material is electrically non-conducting, and said particles provide a local conducting path through said thickness of said adhesive layer.

17. The piezoelectric transducer according to claim 1, wherein said actuating electrodes have such a characteristic as is achieved by forming said actuating electrodes on said outer surfaces of said solid state body by sputtering.

* * * * *